US012610822B2

(12) United States Patent
Shia et al.

(10) Patent No.: US 12,610,822 B2
(45) Date of Patent: Apr. 21, 2026

(54) READILY ASSEMBLED/DISASSEMBLED COOLING ASSEMBLY FOR IMMERSION COOLED SEMICONDUCTOR CHIP PACKAGE

(71) Applicant: Intel Corporation, Santa Clara, CA (US)

(72) Inventors: David Shia, Portland, OR (US); Jimmy Chuang, Taipei (TW); Jin Yang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 874 days.

(21) Appl. No.: 17/711,354

(22) Filed: Apr. 1, 2022

(65) Prior Publication Data

US 2022/0223495 A1    Jul. 14, 2022

(51) Int. Cl.
*H01L 23/427*        (2006.01)
*H01L 23/40*         (2006.01)
(52) U.S. Cl.
CPC ............ *H01L 23/427* (2013.01); *H01L 23/40* (2013.01)
(58) Field of Classification Search
CPC .. H05K 7/1432; H05K 7/203; H05K 7/20218; H05K 7/20236; H05K 7/20263; H05K 7/20272; H05K 7/2029; H05K 7/20318; H05K 7/20327; H05K 7/20336; H05K 7/20381; H05K 7/20409; H05K 7/20418; H05K 7/20445; H05K 7/20254; H05K 7/20663; H05K 7/208; H05K 7/20827;

H05K 7/20872; H05K 7/20881; H05K 7/2089; H05K 7/209; H05K 7/20909; H05K 7/20927; H05K 7/20936;
(Continued)

(56) References Cited

U.S. PATENT DOCUMENTS

2013/0021752 A1*  1/2013  Campbell ............. H01L 23/473
                                          165/138
2021/0320050 A1   10/2021  Robinson et al.
(Continued)

FOREIGN PATENT DOCUMENTS

GB          2576032 B      4/2021
GB          2576030 B      12/2021
(Continued)

*Primary Examiner* — Amir A Jalali
(74) *Attorney, Agent, or Firm* — Hanley, Flight & Zimmerman, LLC

(57) ABSTRACT

A cooling assembly is described. The cooling assembly includes a semiconductor chip package having input/outputs (I/Os) on a first surface and a package lid that is opposite the first surface, the semiconductor chip package has sides between the first surface and the package lid. The cooling assembly includes a structured element. The structured element has a structured surface to nucleate bubbles in a bath of coolant. The structured element has fixturing elements to secure the structured element to at least first and second ones of the sides of the semiconductor chip package. The structured element has a first thermal resistance. The cooling assembly has a thermal interface material between the package lid and the structured element. The thermal interface material has a second thermal resistance that is greater than the first thermal resistance and within an order of magnitude of the first thermal resistance.

20 Claims, 11 Drawing Sheets

(58) Field of Classification Search
CPC ........ H05K 1/0203–0204; H01L 23/04; H01L 23/34; H01L 23/3675; H01L 23/3733; H01L 23/40; H01L 23/4006; H01L 23/4031; H01L 23/405; H01L 23/4056; H01L 23/4087; H01L 23/427; H01L 23/44; H01L 23/473; H01L 23/492; F28D 1/02–0206; F28D 1/0226; F28D 2001/0286; F28F 3/06
See application file for complete search history.

(56) References Cited

U.S. PATENT DOCUMENTS

| | | | | |
|---|---|---|---|---|
| 2021/0327787 A1* | 10/2021 | Yang | H01L 23/3735 | |
| 2022/0201889 A1* | 6/2022 | Sover | H01L 23/427 | |
| 2023/0125822 A1* | 4/2023 | Adebiyi | H01L 23/3737 | 361/699 |
| 2023/0137684 A1* | 5/2023 | Yang | H01L 23/3736 | 257/715 |
| 2023/0163047 A1* | 5/2023 | Marin | H01L 23/427 | 257/715 |
| 2023/0180434 A1* | 6/2023 | Shia | H05K 7/20381 | 361/700 |
| 2023/0253288 A1* | 8/2023 | Adebiyi | H01L 25/0655 | 257/687 |

FOREIGN PATENT DOCUMENTS

| | | |
|---|---|---|
| GB | 2597525 A | 2/2022 |
| GB | 2601357 A | 6/2022 |

* cited by examiner

READILY ASSEMBLED/DISASSEMBLED COOLING ASSEMBLY FOR IMMERSION COOLED SEMICONDUCTOR CHIP PACKAGE

BACKGROUND

Thermal engineers face challenges, particular with respect to high performance computing (centralized cloud computing, consumer graphics and gaming, etc.), as both computers and networks continue to pack higher and higher levels of performance into smaller and smaller packages. Creative cooling solutions are therefore being designed to keep pace with the thermal requirements of such aggressively designed systems.

FIGURES

FIGS. 1*a* and 1*b* depict a liquid cooling apparatus and a liquid cooling assembly, respective (prior art);

Figure 4A:
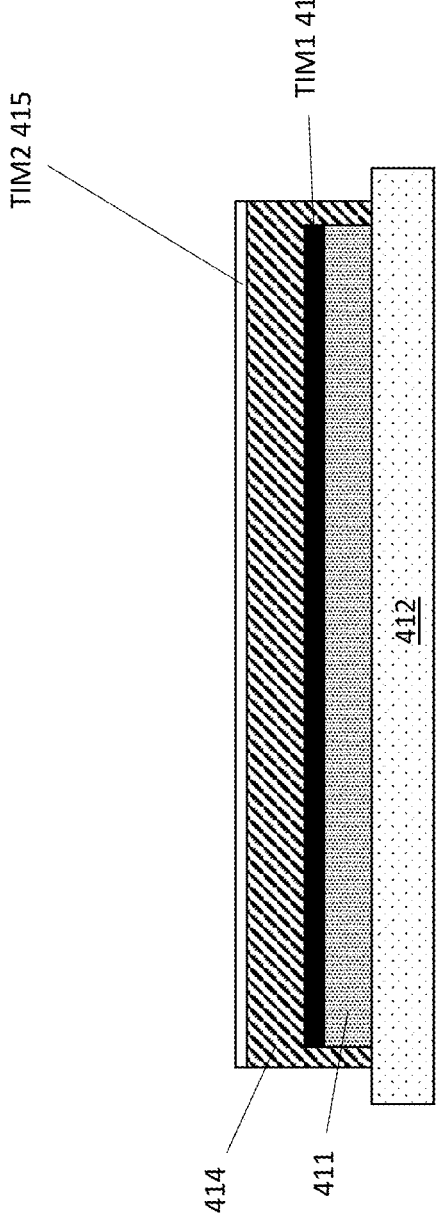
Figure 4B:
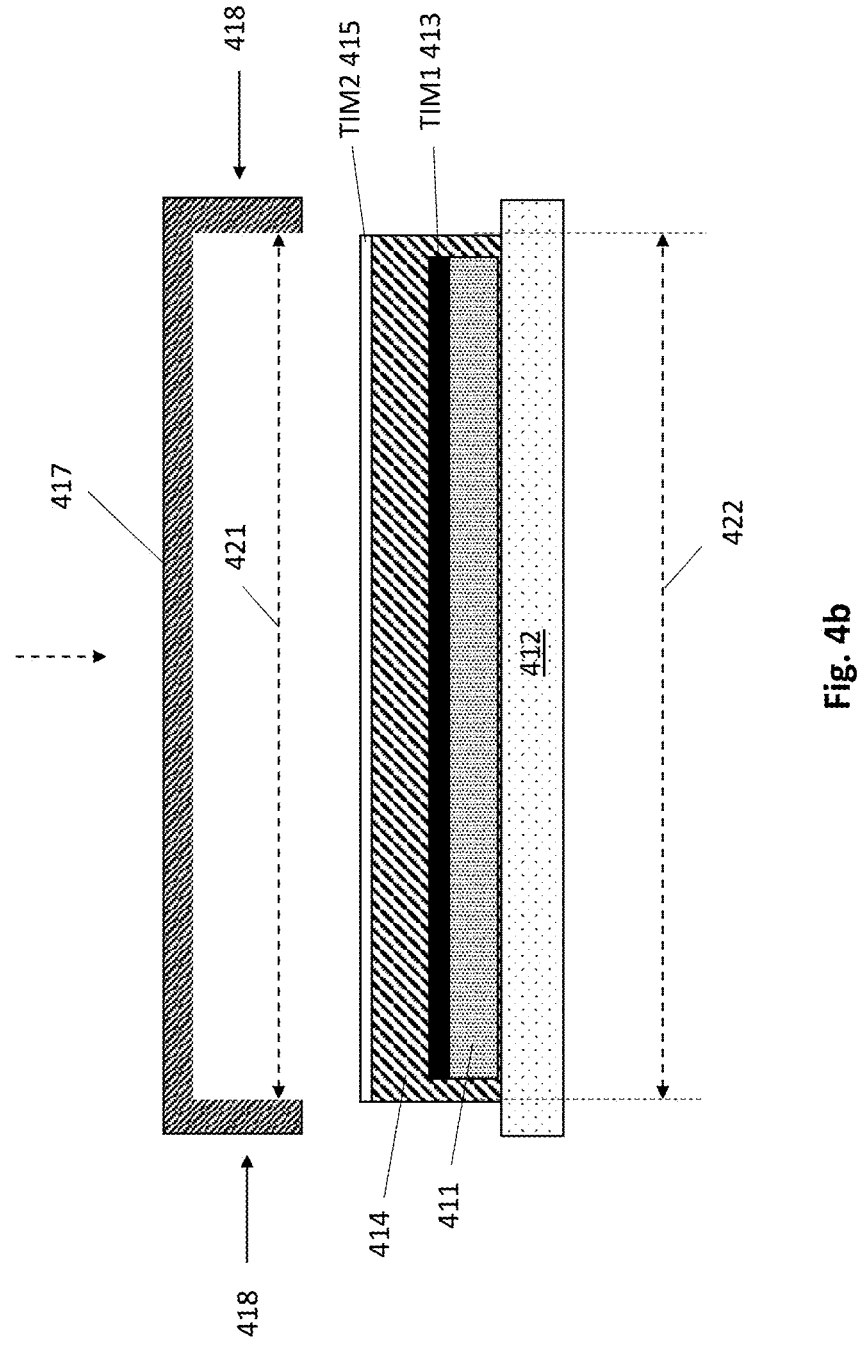
Figure 4C:
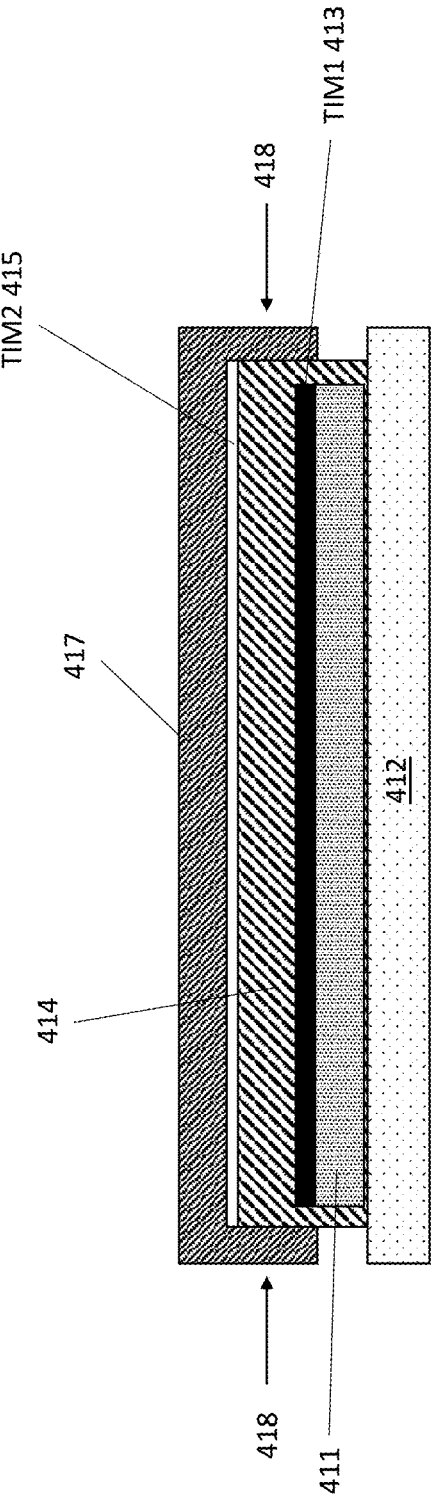
Figure 5:
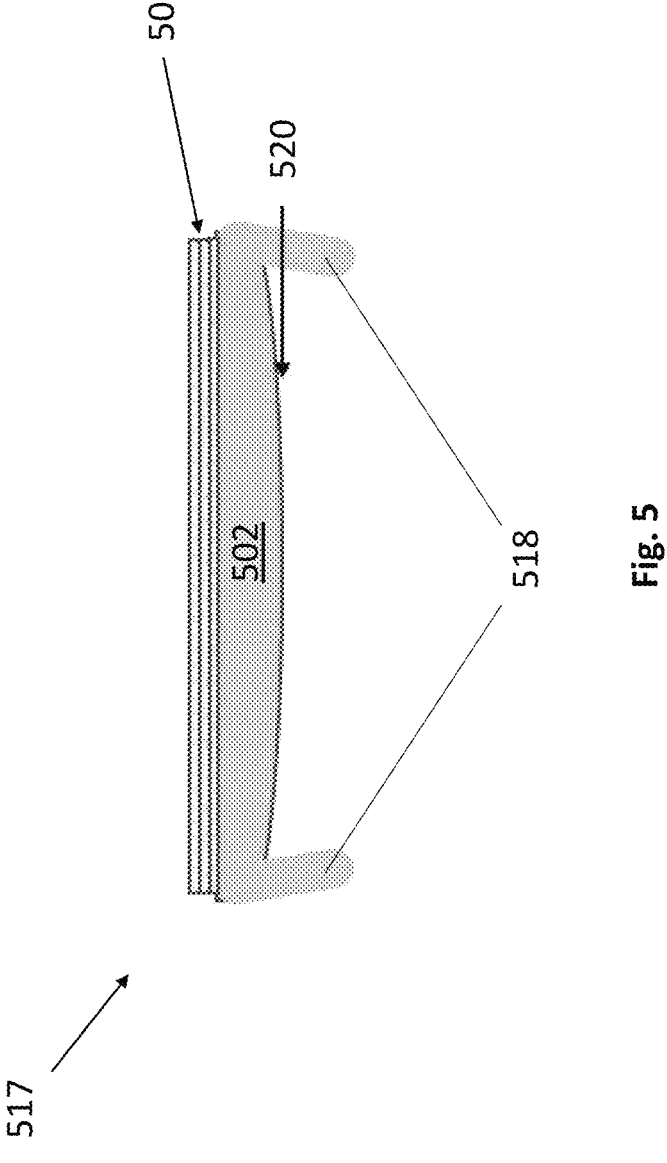
Figure 6:
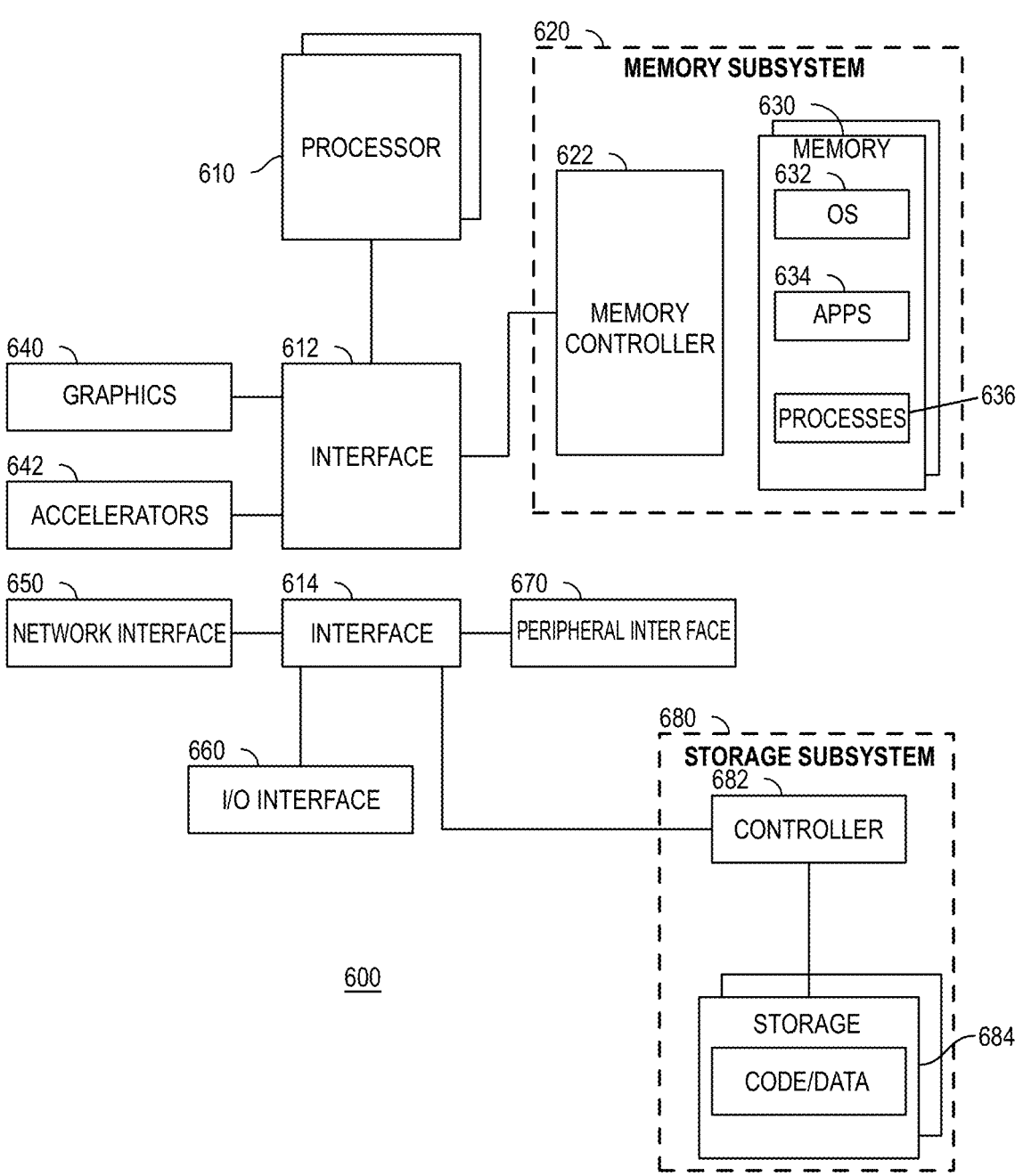
Figure 7:
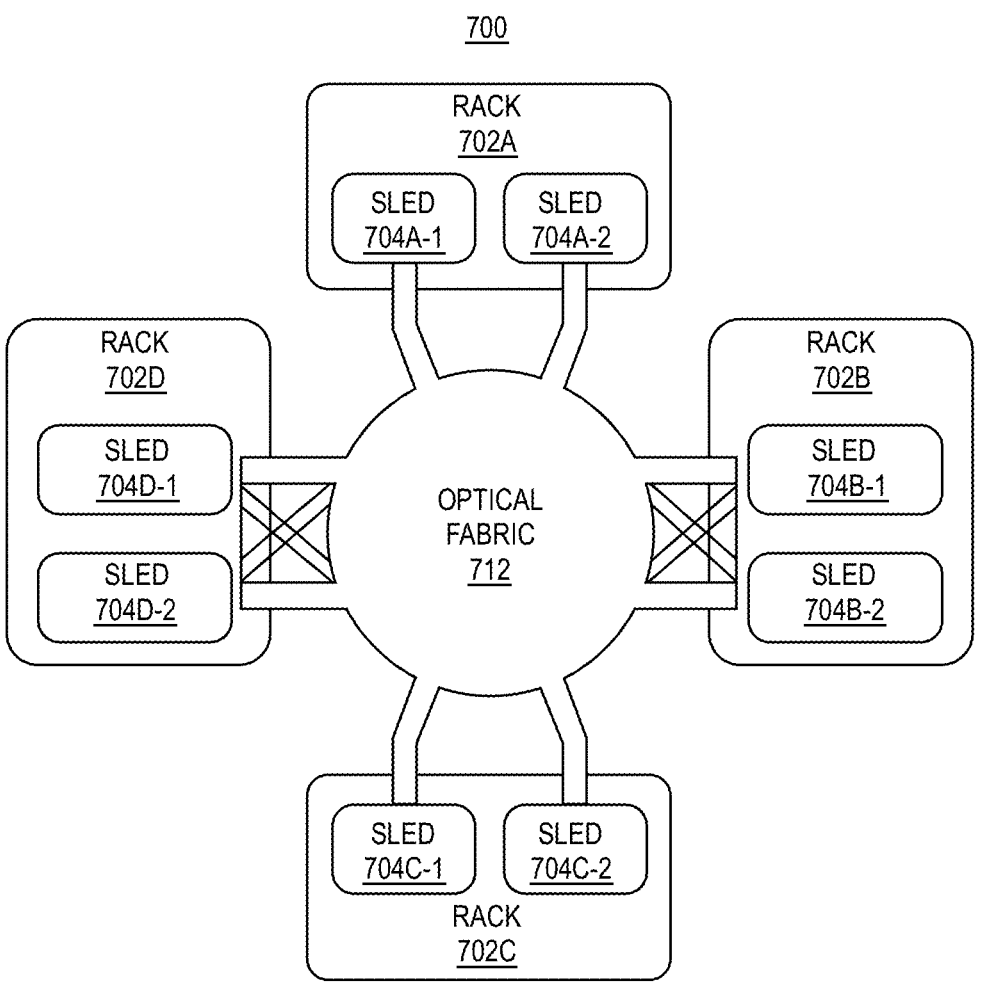
Figure 8:
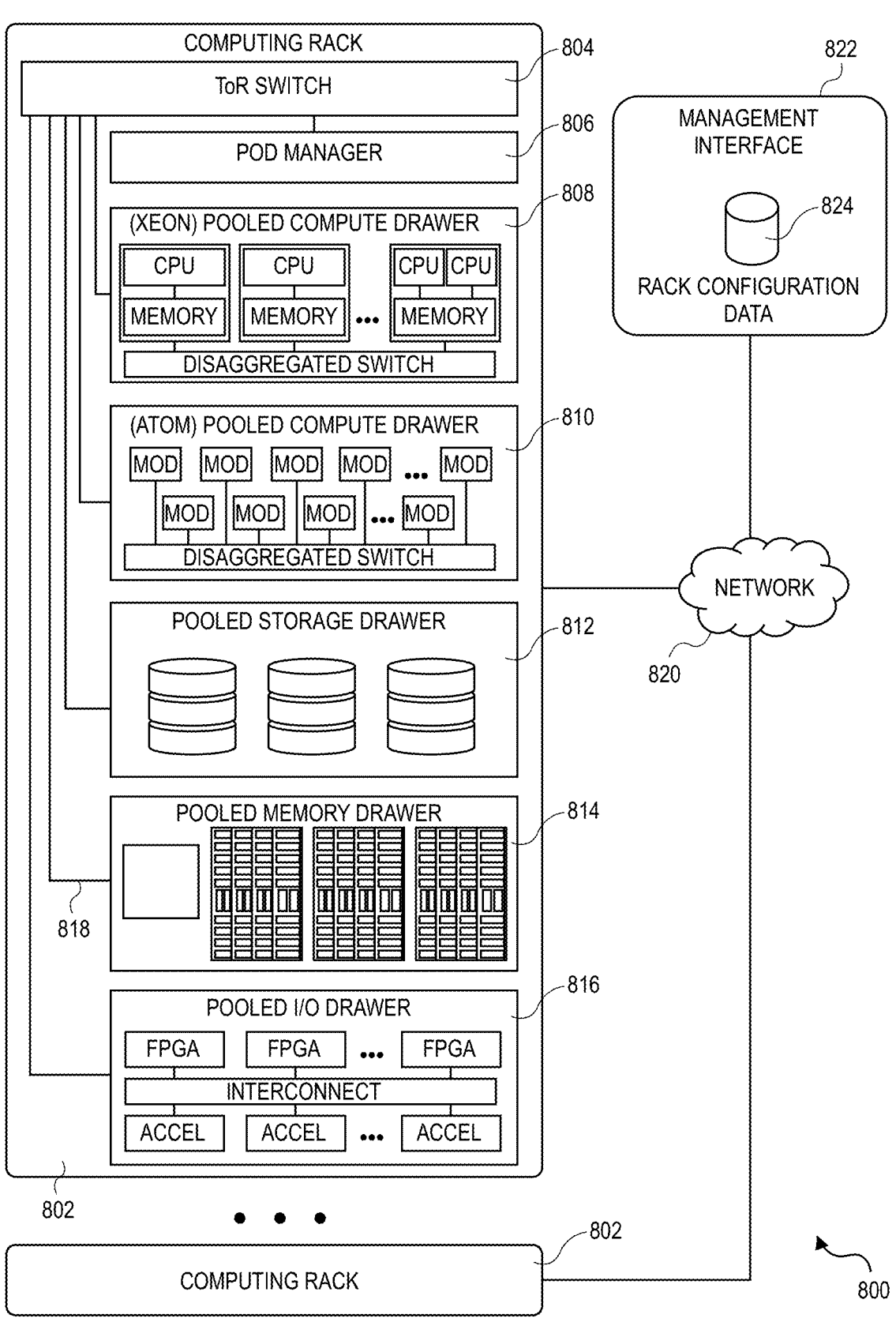

FIGS. 4*a*, 4*b* and 4*c* show an improved structured element being mounted to a semiconductor chip package;

FIG. 5 shows an embodiment of an improved structured element;

FIG. 6 shows an electronic system;

FIG. 7 shows a data center;

FIG. 8 shows a rack.

DETAILED DESCRIPTION

Figure 1A:
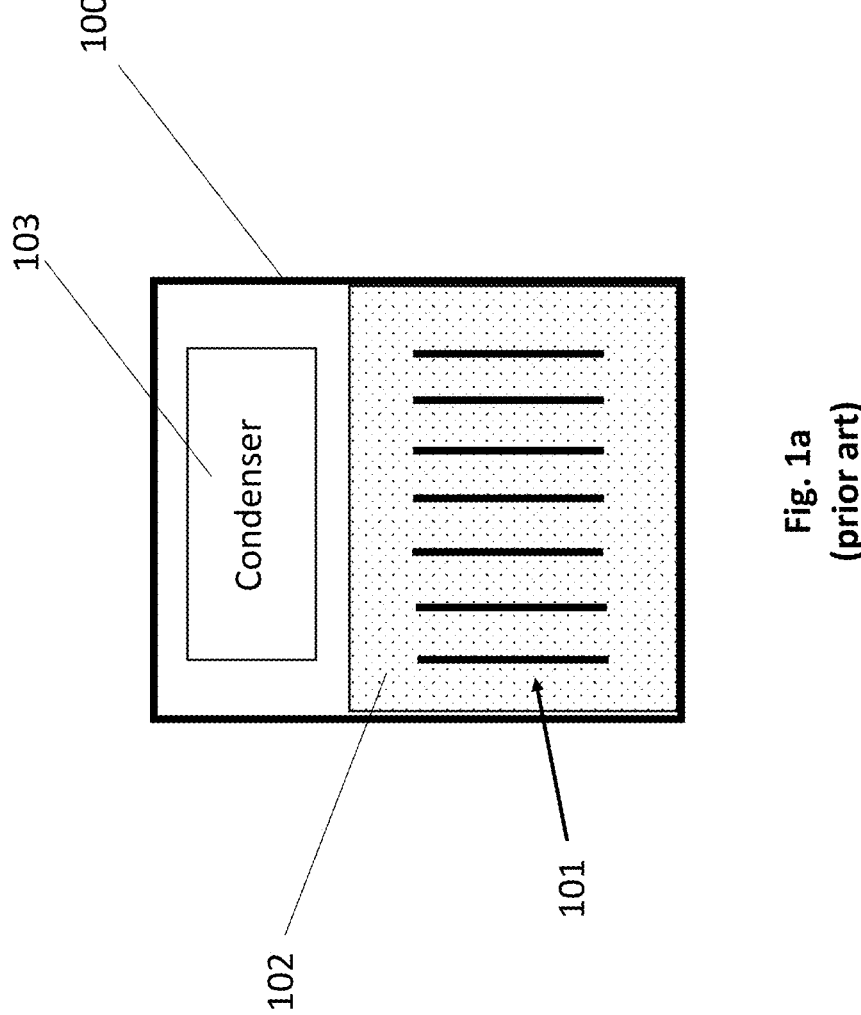

FIG. 1*a* depicts an immersion cooling system 100. As observed in FIG. 1*a*, one or more electronic circuit boards 101 are immersed in a bath of thermally conducting but electrically insulating liquid coolant 102 while electrical components (e.g., packaged semiconductor chips) that are disposed on the electrical circuit boards 101 are powered on and operating. Heat from the operating semiconductor chips is transferred to the liquid coolant 102. The immersion of the boards 101 and their components within the bath 102 maximizes the surface area over which heat from the operating semiconductor chips is released into the liquid coolant 102.

According to a first thermal transfer process, referred to as "convection" cooling, the temperature of the coolant 102 warms in response to the heat from the electronic system but does not boil (the temperature of the bath coolant 102 remains below the liquid's boiling point).

A second (e.g., following) thermal transfer process, referred to as "two-phase" or "phase transition" cooling can occur e.g., if the electronics continuously operate above a certain power within the liquid coolant 102. In this case, the heat that is transferred into the liquid 102 can cause the liquid's temperature (e.g., in the proximity of the semiconductor devices) to exceed its boiling point. In this case the liquid 102 boils which converts the liquid 102 into a vapor. The vapor rises into an ambient having a condenser 103 which removes heat from the overall system. The cooling activity of the condenser 103 converts the vapor back to a liquid which is returned to the bath 102.

Both of the thermal processes described above can remove heat from the operating semiconductor chips more efficiently than traditional air cooled systems because the liquid coolant 102 has higher specific heat and latent heat than air (a higher specific heat helps improve convection cooling whereas a higher latent heat helps improve two-phase cooling).

Figure 1B:
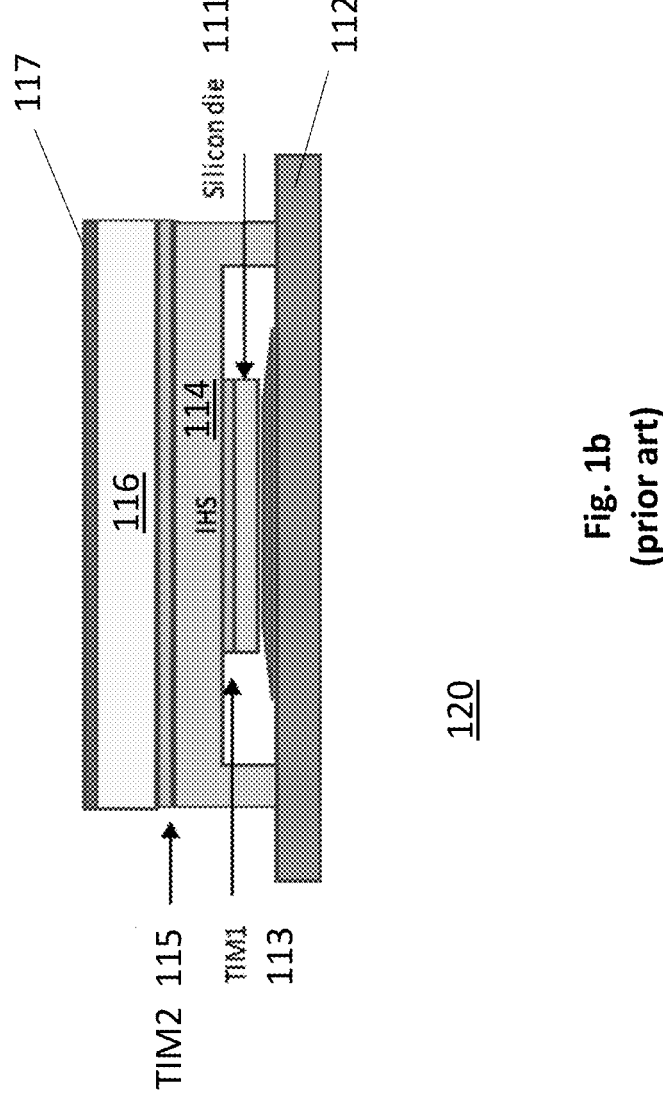

FIG. 1*b* shows a prior art cooling assembly 120 that is designed to transfer heat from a packaged semiconductor chip 111 to a liquid coolant immersion bath. The semiconductor chip's input/output (I/O) connections (not shown) are mounted to a package substrate 112. The package substrate 112 and the package substrate's I/Os (also not shown) are considered to be the bottom of the package (the package substrate's I/Os electrically couple the package to a circuit board). A first thermal interface material (TIM) 113 is sandwiched between the top of the semiconductor chip 111 and the underside of the chip package lid 114 (which can also be referred to as an integrated heat spreader (IHS)).

A second TIM 115 is located on the top of the package lid 114. A thermally conductive mass block 116 (e.g., a solid block of copper) is placed on the second TIM 115. A thermally conductive element 117 having a "structured" or otherwise non-planar surface topography (e.g., a stack of copper meshes, a surface that has been roughened, a surface that has been patterned to form pillars or columns that emanate from the surface, etc.) is then bonded to or processed/patterned directly into the top of the mass block 116. The non-planar surface topography, also referred to as a boiling enhancement layer (BEL), helps nucleate bubbles within the immersion bath.

The cooling assembly of FIG. 1*b* is designed to transfer heat from the semiconductor chip 111 to the structured element 117 with as little thermal resistance as is practicable. That is, a high thermal conductivity is meant to exist between the semiconductor chip 111 and the structured element 117 so that a large percentage of the heat generated by the semiconductor chip 111 is transferred to the immersion bath.

Sufficiently low thermal resistance, however, has generally been achieved with either of two approaches: 1) a high loading force mechanical assembly (not shown in FIG. 1*b*) is added to a cooling assembly having a soft second TIM layer 115 (e.g., paste or gel) to press the mass block 116 against the chip package lid 114 with extremely high pressure (thereby conforming the paste/gel TIM to the surface topographies of the chip package lid 114 and mass block 116); 2) the mass block 116 is brazed or soldered to the chip package lid 114 with a material having extremely high thermal conductivity. Variants of both of these approaches include eliminating the mass block 116 such that the structured element 117 is attached directly to the chip package lid 114.

Unfortunately, none of the approaches above correspond to easy application/removal of the structured element 117 and/or mass block 116 to/from the chip package lid 114. With a high loading force mechanical assembly, a technician has to expend the time and effort to manually build or disassemble the mechanical assembly. In the case of the later, removal of the mass block 116 or structured element 117 from the package lid 114 is impossible. Ideally, a technician is able to repeatably add/remove the cooling assembly component(s) to/from the chip package lid 114 with ease.

Notably, if a thermally conductive mass block 116 and/or structured element 117 is simply placed on a second TIM layer 115 having standard bond line thickness (in the hundreds of microns) and without any high loading force mechanical assembly to press the mass block 116 or structured element 117 into the package lid 114 with high pressure, the thermal resistance of the overall cooling assembly can be 0.05° C./W or higher for a standard chip package and corresponding mass block 116 surface area which is insufficient for high performance semiconductor chips.

Here, the second TIM layer 115 is problematic because the TIM material has inherently higher thermal resistance than the metals (e.g., copper, aluminum, etc.) that the mass block 116 and structured element 117 are composed of. As a consequence, the second TIM layer 115 is the largest contributor to the thermal resistance of the overall cooling assembly and has a thermal resistance that is an order of magnitude (factor of ten) greater than that of the mass block 116 or the structured element 117.

Figure 2:
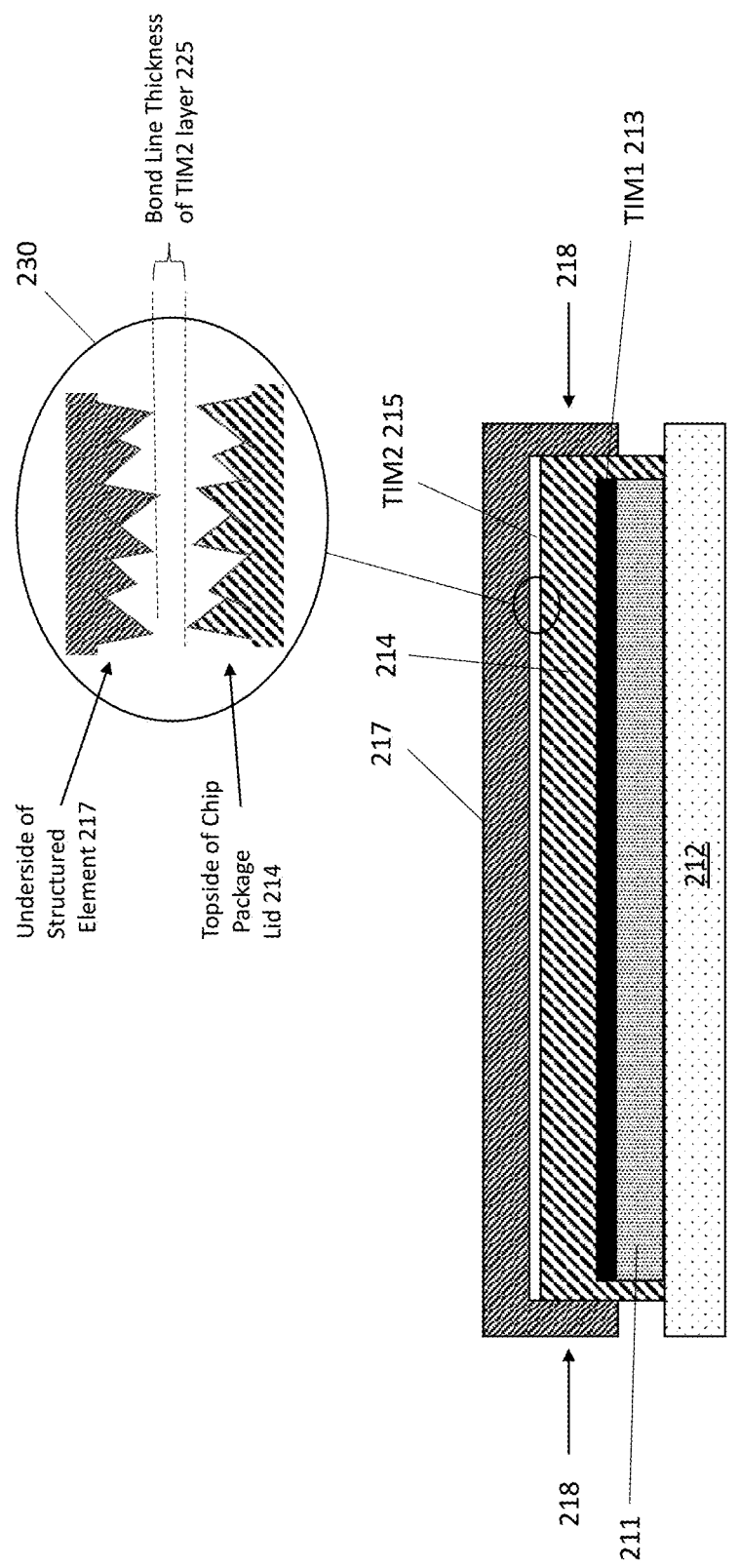
FIG. 2 shows an improved liquid cooling assembly.

FIG. 2 shows an improved solution that places an attachable/removeable structured element 217 to a chip package lid 214 of a packaged semiconductor chip 211 with a second, extremely thin TIM layer 215 in between. FIG. 2 also shows a package substrate 212 and a first TIM layer 213. Here, as observed in FIG. 2, the new structured element 217 includes fixturing elements 218 (e.g., clips, clamps, etc.) that mechanically grip the semiconductor chip package in some way (for ease of drawing, the BEL is not depicted on the top surface of the structured element 217). The fixturing elements 218 are designed so that the structured element 217 easily attaches/releases to/from the chip package. As such, a technician can easily attach/remove the structured element 217 to/from the chip package (e.g., with finger pressure pressing against the fixturing elements).

Importantly, the second TIM layer 215 is extremely thin (e.g., the bond line thickness is 100 μm or less) and demonstrates unconventionally low thermal resistance. In various embodiments, the thermal resistance of the second TIM layer 215 is within an order of magnitude of the thermal resistance of the structured element 217.

Here, it is pertinent to recognize that the thermal resistance of the second TIM layer 215 is proportional to its bond line thickness 231. As such, even though the second TIM layer 215 is composed of a conventional soft TIM material (e.g., a gel, past or grease) having much lower thermal conductivity than a metal, a low thermal resistance is nevertheless achieved through the second TIM layer 215 by incorporating only a small amount of TIM material between the structured element 217 and the chip package lid 214. Here, inset 230 shows the bond line thickness 231 of the second TIM layer 215 between the lower surface of the structured element 227 and the upper surface of the chip package lid 224. In various embodiments the bond line thickness 231 of the second TIM layer 215 is 100 μm or less.

Here, as is known in the art, metals have extremely high thermal conductivities in the hundreds of W/mk (e.g., copper has a thermal conductivity of approximately 400 W/mk, aluminum has a thermal conductivity of approximately 220 W/mk, etc.). By contrast, conventional TIM materials have thermal conductivities in the single digits (e.g., within a range of 2.0 to 8.0 W/mk).

Referring to inset 230 of FIG. 2, traditional TIM materials, being soft like a grease, gel or paste, are used to increase the surface area of thermal transfer between two materials thereby increasing the thermal conductivity between them. The surface roughness/topography of a metal is typically in the tens of microns (root-mean-square (rms)). When two metal surfaces having such topography are in contact with one another there is, in fact, very little actual contact between them (e.g., only the "peaks" of a particular metal surface touch the "peaks" of the other metal surface). This limited contact per unit area creates a high thermal contact resistance between the metal surfaces.

A TIM material 215, being soft, readily fill the "valleys" in the rough surface topography of metal surfaces of the structured element 217 and the chip package lid 214 which, in turn, greatly increases the surface area between them which, in turn, greatly reduces their thermal contact resistance. The reduction in thermal contact resistance significantly reduces the overall thermal resistance between the metal surfaces of the structured element 217 and the chip package lid 214 even though the TIM material can have two orders of magnitude lower thermal conductivity than either of the metals. Thus, the less thermally conductive TIM material 215, being soft, reduces the thermal contact resistance between materials of the structured element 217 and the chip package lid 214 having significantly higher thermal conductivity.

Nevertheless, if the TIM layer 215 is made too thick, the thermal resistance of the interface between the metal surfaces of the structured element 217 and the chip package lid 214 is dominated by the lower thermal conductivity of the TIM 215 rather than the higher thermal conductivity of the metals of the structured element 217 and the chip package lid 214 that the TIM 215 is placed between (the improvement in thermal contact area provided by the TIM 215 is offset by the distance the heat must travel through the less thermally conductive TIM 215).

In practice, TIMs are commonly specified to have a minimum bond line thickness in the hundreds of microns, e.g., to ensure they cover and fill the gaps between the surfaces they are placed between. In various embodiments of the improved approach of FIG. 2, however, the bond line thickness 225 of the second TIM layer 215 is in the tens of microns (100 μm or less). As described above, such a low thickness greatly reduces the total thermal resistance of the TIM material and its contribution to the overall thermal resistance of the cooling assembly.

In various embodiments, the bond line thickness of the second TIM layer 215 is small enough to keep the thermal resistance of the second TIM layer 215 within an order of magnitude of the thermal resistance of the structured element 217.

For example, if the structured element 217 is composed of copper having a thickness of 1 cm, the structured element 217 has a thermal resistance of approximately 2.5E-5 C/W ((0.01 m)/(400 (W/mK))≈2.5E-5 Cm²/W). Whereas, if the second TIM layer 215 has a thermal conductivity of 2 W/mK but a thickness of only 100 μm, the second TIM layer 215 has a thermal resistance of approximately 5E-5 C/W ((0.0001 m)/(2 (W/mK))≈5E-5 Cm²/W). As such, the thermal resistance of the TIM layer 215 (5E-5 Cm²/W) is greater than the thermal resistance of the structured element 217 (2.5E-5 Cm²/W) by only a factor of two (note that these values are expressed in terms of any thermal contact surface area whereas the data of FIG. 3 (discussed immediately below) involved a specific thermal contact surface area hence the difference in magnitude of the above calculated thermal resistance values versus those observed/discussed in FIG. 3 immediately below).

Figure 3:
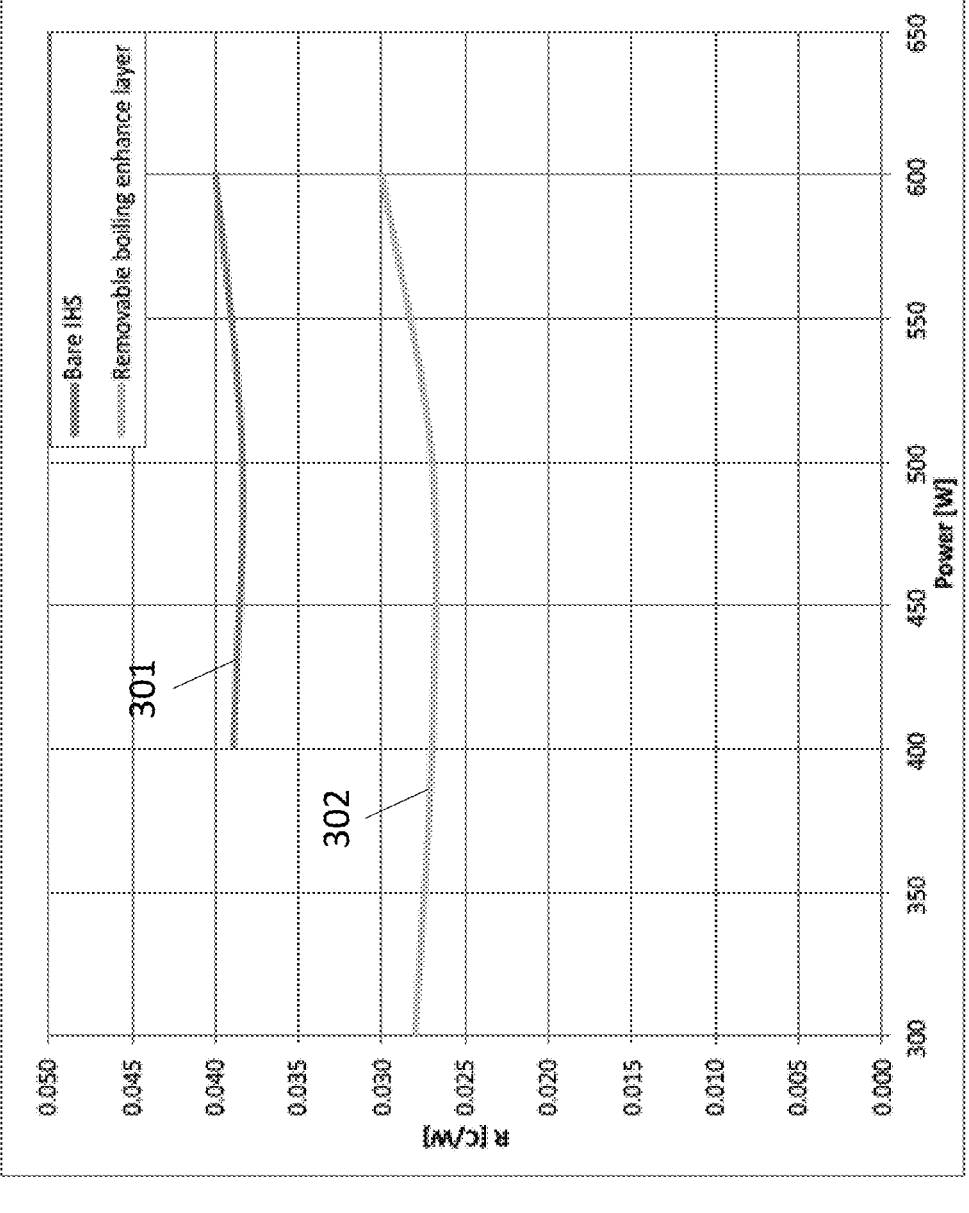
FIG. 3 shows thermal resistance as a function of chip power for a structured element having a thin TIM layer between itself and a chip package lid.

FIG. 3 demonstrates the phenomena in more detail. Here, FIG. 3 compares the thermal resistance demonstrated by a chip package immersed in liquid coolant by itself 301 (i.e., without any structured element or TIM material placed upon its lid), and, the thermal resistance demonstrated by the same chip package when it is immersed in the same liquid coolant with a structured element placed upon the lid of the chip package with a very thin TIM material (thickness of less than 100 μm) between the structured element and the chip package lid 302. Importantly, the structured element is not pressed against the chip package lid with a high loading force (the structured element simply sits upon the thin TIM layer and chip package lid).

As observed in FIG. 3, the thermal resistance of the solution having the structured element and the thin TIM layer 302 not only demonstrates superior thermal transfer characteristics as compared to the chip package by itself 301 but also demonstrates a thermal resistance that is acceptable for packages having high power semiconductor chips and typical thermal contact surface area between the package lid and the cooling assembly (e.g., approximately 0.026 C/W at 500 W). The superior performance results not only from the presence of the structured element (which helps nucleate bubbles for two phase cooling) but also the reduced contribution to the overall thermal resistance from the thin TIM layer.

Importantly, the acceptable cooling performance is achieved without any loading force applied to the structured element which verifies the design philosophy of the improved approach of FIG. 2. More specifically, referring back to FIG. 2, the fixturing elements 218 that secure the structured element 217 to the chip package are designed for easy application/removal and therefore do not apply a high loading force (e.g., a technician can press fit the structured element 217 onto the chip package with finger pressure and release the fixturing elements 218 with finger pressure).

FIGS. 4a through 4c demonstrate an embodiment of a process for constructing the cooling assembly of FIG. 2 on a chip package. As shown in FIGS. 4a through 4c, the chip package includes a semiconductor chip 411, a package substrate 412, and a first TIM layer 413. First, as observed in FIG. 4a, the second TIM material 415 is disposed on the chip package lid 414. Here, a thin coat of the second TIM material can be applied on the chip package lid (e.g., by spray or with a brush), and/or, balls/droplets of the second TIM material 415 can placed on the chip package lid, e.g., evenly spaced apart according to some pattern. In the case of the later, the balls/droplets spread out over the surface of the chip package lid 414 when the structured element is mounted to the chip package lid 414.

In various embodiments, the total amount of second TIM material 415 that is disposed on the chip package lid (e.g., by weight, by volume, etc.) is kept below some maximum limit to ensure that the a thin bond line thickness of the second TIM layer 415 (e.g., less than 100 μm) after the structured element is secured to the chip package lid 414. In some implementations, there is less than 100% coverage of the second TIM layer 415 on the chip package lid 414 to ensure a thin second TIM layer 415 (the TIM layer 415 does not spread out over the entire surface area of the chip package lid). Here, any loss in thermal contact resistance owing to less than full surface area coverage of the chip package lid 414 is compensated for by the thin TIM layer 415 and the resulting low thermal resistance in the direction of heat transfer.

As observed in FIGS. 4b and 4c, after the second TIM layer 415 has been placed on the package lid 414, the structured element 417 is placed on the chip package (again, for ease of drawing the BEL structures of the structured element 417 are not shown). In various embodiments the structured element 417 is composed of a metal (such as copper or aluminum) or metal alloy (e.g., brass). The structured element 417 can be a single mass or block that is processed or molded into its final shape (including BEL features). Alternatively, the structured element 417 is composed of multiple elements (e.g., a top piece having the BEL structures for bubble nucleation that is bonded to a lower floor piece that interfaces with the chip package lid 414).

In various embodiments, as observed in FIG. 4b, the structured element 417 has mechanical fixturing elements such as clips 418 that are implemented as tabs or fingers (hereinafter, "tabs") that extend downward from the body of the structured element 417. Here, the tabs 418 are an extension of the body of the structured element 417 (rather than being a separate component that is screwed, riveted or otherwise mounted to the body of the structured element 417). For example, if the structured element 417 is formed from a mold (e.g., by molding or die casting), the mold includes features for the tabs 418.

In an embodiment, the distance 421 between the respective ends of a pair of tabs 418 on opposite sides of the chip package is slightly less than the width 422 of the chip package that the structured element 417 is mounted upon. As such, when the structured element 417 is pressed upon the chip package as observed in FIGS. 4b and 4c, the tabs 418 are bent outward to accommodate the wider width of the chip package.

With the tabs 418 being composed of the same hard material as the structured element 417 (e.g., metal) they resist the bending and try to return back to their nominal shape, which, in turn exerts a mostly horizontal loading force against the sides of the chip package and mounts the structured element 417 to the chip package. In various embodiments, the structured element 417 exerts less than 1.5 MPa of downward pressure upon the chip package lid 414 when attached to it by the tabs 418.

Notably the tabs 418 have enough mass (are thick enough) to apply a suitable horizontal loading force that keeps the fixtured element 417 attached to the chip package, while, at the same time, do not have enough mass (are thin enough) to allow a technician to easily push/pull the structured element 417 on/off of the chip package, e.g., with finger pressure. In one embodiment, the tabs 418 are designed such that exertion by a technician of 5 lbs or less is enough to push/pull the structured element 417 on/off the chip package.

FIG. 5 elaborates on some additional design details that can be applied to the structured element. As just an example, FIG. 5 depicts a structured element 517 implemented as a stack of copper meshes 501 (to nucleate bubbles) that are bonded to the top of a floor piece 502.

Firstly, the tabs 518 are formed to extend inward (toward the center of the chip package lid). Extending the tabs 518 inward improves their ability to act as a clip that secures the structured element 517 to the chip package. That is, the more the tabs 518 bend inward, the more they will resist the pressing of the structured element 517 onto the chip package thereby increasing the aforementioned horizontal loading forces.

In various embodiments, when the structured element 517 is pressed upon the chip package and the tabs 518 bend outward in response, the bending of the tabs 518 induces the floor piece 502 to bow such that the middle of the floor piece's bottom surface rises higher off of the chip package lid than the edges of the flood piece's bottom surface. If the floor piece 502 were to bow in this manner, the bottom surface of the structured element 517 would not be flush against the chip package lid, which, in turn, would result in increased thermal resistance from the chip package lid to the structured element 517.

A solution, therefore, is to form the structured element 517 with a convex bottom surface 520. Here, if the structured element 517 is formed with a convex bottom surface 520 and "bows" is response to the stress induced by the tabs 518 when the structured element is pressed upon the chip package as described just above, the bowing of the convex surface 520 will produce a flat surface at the bottom of the structured element 517. That is, the convex surface 520 compensates for the bowing.

Thus, even though the bowing occurs, the structured element 517 presents a flat surface to the chip package lid as it is applied to the chip package lid. With a flat bottom surface, the structured element 517 will be flush against the chip package lid thereby creating a thermal interface with little thermal contact resistance.

In any of the embodiments above the surface of the chip package lid 214 and/or the underside surface of the structured element 217 can be processed in some way (e.g., electro-mechanical or chemically polished) to reduce surface roughness (e.g., to 30 μm or less rms) so as to realize a second TIM layer 215 having very thin bond line thickness. Here, generally, as the crevices/gaps in the metal surfaces of the chip package lid 214 and the structured element 217 that the TIM layer 215 is located between become shallower, less TIM material 215 can be used to form a suitably low contact resistance junction between the surfaces of the chip package lid 214 and the structured element 217.

The larger immersion cooling system that the cooling assembly described above is placed within can take on various different forms. For example, according to a first approach, referring back to FIG. 1, for two phase immersion cooling, the condenser 103 is within the ambient of the same chamber 100 as the liquid coolant 102 and the electronics 101.

According to a second approach, hot vapor in the ambient is drawn out of the chamber (via an exit port in the chamber) and into an external condenser (e.g., by a pump that is coupled in series with the external condenser and the chamber). The external condenser converts the hot vapor to a cooled liquid which is returned to the chamber (via a cooled fluid input port). Here, hot vapor from multiple cooling chambers can be directed to the external condenser which concurrently cools the vapor from multiple chambers and provides them with cooled fluid.

In any of these embodiments, the electronics within a chamber immersion bath can include electronic circuit boards and/or entire systems (e.g., servers) packaged in a mechanical housing that contains circuit boards.

Although embodiments described above have referred to a single semiconductor chip within a semiconductor package, the teachings herein can be extended to semiconductor chip packages having more than one semiconductor chip. As such, the term "semiconductor chip package" and the like refer to a semiconductor chip package having one or more semiconductor chips.

The following discussion concerning FIGS. 6, 7, and 8 are directed to systems, data centers, and rack implementations, generally. FIG. 6 generally describes possible features of an electronic system that can include one or more semiconductor chip packages having a cooling assembly that is designed according to the teachings above. FIG. 7 describes possible features of a data center that can include such electronic systems. FIG. 8 describes possible features of a rack having one or more such electronic systems installed into it.

FIG. 6 depicts an example system. System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 600 includes interface 612 coupled to processor 610, which can represent a higher speed interface or a high throughput interface for system components that needs higher bandwidth connections, such as memory subsystem 620 or graphics interface components 640, or accelerators 642. Interface 612 represents an interface circuit, which can be a standalone component or integrated onto a processor die. Where present, graphics interface 640 interfaces to graphics components for providing a visual display to a user of system 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 640 generates a display based on data stored in memory 630 or based on operations executed by processor 610 or both. In one example, graphics interface 640 generates a display based on data stored in memory 630 or based on operations executed by processor 610 or both.

Accelerators 642 can be a fixed function offload engine that can be accessed or used by a processor 610. For example, an accelerator among accelerators 642 can provide compression (DC) capability, cryptography services such as public key encryption (PKE), cipher, hash/authentication capabilities, decryption, or other capabilities or services. In some embodiments, in addition or alternatively, an accelerator among accelerators 642 provides field select controller capabilities as described herein.

In some cases, accelerators 642 can be integrated into a CPU socket (e.g., a connector to a motherboard or circuit board that includes a CPU and provides an electrical interface with the CPU). For example, accelerators 642 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs).

Accelerators 642 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

The system can also include an infrastructure processing unit (IPU) or data processing unit (DPU) to process the requests received by the system and dispatch them to an appropriate processor or accelerator within the system.

Memory subsystem 620 represents the main memory of system 600 and provides storage for code to be executed by processor 610, or data values to be used in executing a routine. Memory subsystem 620 can include one or more memory devices 630 such as read-only memory (ROM), flash memory, volatile memory, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software functionality to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs, and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

The memory resources can also be tiered (different access times are attributed to different regions of memory), disaggregated (memory is a separate (e.g., rack pluggable) unit that is accessible to separate (e.g., rack pluggable) CPU units), and/or remote (e.g., memory is accessible over a network).

While not specifically illustrated, it will be understood that system 600 can include one or more buses or bus systems between devices, such as a memory bus, a graphics bus, interface buses, or others. Buses or other signal lines can communicatively or electrically couple components together, or both communicatively, and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 600 includes interface 614, which can be coupled to interface 612. In one example, interface 614 represents an interface circuit, which can include standalone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can transmit data to a remote device, which can include sending data stored in memory. Network interface 650 can receive data from a remote device, which can include storing received data into memory. Various embodiments can be used in connection with network interface 650, processor 610, and memory subsystem 620.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage 684 holds code or instructions and data in a persistent state (e.g., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (e.g., the value or state of the data is indeterminate if power is interrupted to system 600). In one example, storage subsystem 680 includes controller 682 to interface with storage 684. In one example controller 682 is a physical part of interface 614 or processor 610 or can include circuits in both processor 610 and interface 614.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base, and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 600. More specifically, power source typically interfaces to one or multiple power supplies in system 600 to provide power to the components of system 600. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 600 can be implemented as a disaggregated computing system. For example, the system 600 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 6, other types of systems to which the above described invention can be applied and are also partially or wholly described by FIG. 6 are communication systems such as routers, switches, and base stations.

FIG. 7 depicts an example of a data center. Various embodiments can be used in or with the data center of FIG. 7. As shown in FIG. 7, data center 700 may include an optical fabric 712. Optical fabric 712 may generally include a combination of optical signaling media (such as optical cabling) and optical switching infrastructure via which any particular sled in data center 700 can send signals to (and receive signals from) the other sleds in data center 700. However, optical, wireless, and/or electrical signals can be transmitted using fabric 712. The signaling connectivity that optical fabric 712 provides to any given sled may include connectivity both to other sleds in a same rack and sleds in other racks.

Data center 700 includes four racks 702A to 702D and racks 702A to 702D house respective pairs of sleds 704A-1 and 704A-2, 704B-1 and 704B-2, 704C-1 and 704C-2, and 704D-1 and 704D-2. Thus, in this example, data center 700 includes a total of eight sleds. Optical fabric 712 can provide sled signaling connectivity with one or more of the seven other sleds. For example, via optical fabric 712, sled 704A-1 in rack 702A may possess signaling connectivity with sled 704A-2 in rack 702A, as well as the six other sleds 704B-1, 704B-2, 704C-1, 704C-2, 704D-1, and 704D-2 that are distributed among the other racks 702B, 702C, and 702D of data center 700. The embodiments are not limited to this example. For example, fabric 712 can provide optical and/or electrical signaling.

FIG. 8 depicts an environment 800 that includes multiple computing racks 802, each including a Top of Rack (ToR) switch 804, a pod manager 806, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 808, and INTEL® ATOM™ pooled compute drawer 810, a pooled storage drawer 812, a pooled memory drawer 814, and a pooled I/O drawer 816. Each of the pooled system drawers is connected to ToR switch 804 via a high-speed link 818, such as a 40 Gigabit/second (Gb/s) or 100 Gb/s Ethernet link or an 100+ Gb/s Silicon Photonics (SiPh) optical link. In one embodiment high-speed link 818 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 800 may be interconnected via their ToR switches 804 (e.g., to a pod-level switch or data center switch), as illustrated by connections to a network 820. In some embodiments, groups of computing racks 802 are managed as separate pods via pod manager(s) 806. In one embodiment, a single pod manager is used to manage all of the racks in the pod. Alternatively, distributed pod managers may be used for pod management operations. RSD environment 800 further includes a management interface 822 that is used to manage various aspects of the RSD environment. This includes managing rack configuration, with corresponding parameters stored as rack configuration data 824.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds, and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner, or syntax, for instructing a machine, computing device, or system to perform a certain function. The instructions may be implemented using any suitable high-level, low-level, object-oriented, visual, compiled, and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software, and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. A cooling assembly, comprising:
a semiconductor chip package having input/outputs (I/Os) on a first surface and a package lid that is opposite the first surface, the semiconductor chip package including sides between the first surface and the package lid;
a structured element, the structured element comprising including a structured surface to nucleate bubbles in a bath of coolant, the structured element including fixturing elements to secure the structured element to at least first and second ones of the sides of the semiconductor chip package, the structured element having a first thermal resistance; and
thermal interface material between the package lid and the structured element, the thermal interface material having a second thermal resistance that is greater than the first thermal resistance and within an order of magnitude of the first thermal resistance.

2. The cooling assembly of claim 1, wherein the thermal interface material has a bond line thickness that is 100 μm or less.

3. The cooling assembly of claim 1, wherein there is less than 100% coverage of the thermal interface material on the package lid.

4. The cooling assembly of claim 1, wherein the thermal interface material includes at least one of:
a) a paste;
b) a gel; or
c) a grease.

5. The cooling assembly of claim 1, wherein the fixturing elements include a first clip and a second clip.

6. The cooling assembly of claim 5, wherein a distance between the first clip and the second clip is less than a width of the package lid.

7. The cooling assembly of claim 5, wherein the first clip and the second clip point inward toward a middle region of the structured element.

8. An apparatus, comprising:
a circuit board to be immersed in a coolant bath within a chamber;
a semiconductor chip package coupled to the circuit board, the semiconductor chip package to be immersed in the coolant bath, the semiconductor chip package having input/outputs (I/Os) on a first surface and a package lid that is opposite the first surface, the I/Os coupled to the circuit board, the semiconductor chip package including sides between the first surface and the package lid;
a structured element, the structured element to be immersed in the coolant bath, the structured element including a structured surface to nucleate bubbles in the coolant bath, the structured element including fixturing elements that secure the structured element to at least first and second ones of the sides of the semiconductor chip package, the structured element having a first thermal resistance; and
thermal interface material between the package lid and the structured element, the thermal interface material having a second thermal resistance that is greater than the first thermal resistance and within an order of magnitude of the first thermal resistance.

9. The apparatus of claim 8, wherein the thermal interface material has a bond line thickness that is 100 μm or less.

10. The apparatus of claim 8, wherein there is less than 100% coverage of the thermal interface material on the package lid.

11. The apparatus of claim 8, wherein the thermal interface material includes at least one of:
a) a paste;
b) a gel; or
c) a grease.

12. The apparatus of claim 8, wherein the fixturing elements include a first clip and a second clip.

13. The apparatus of claim 12, wherein a distance between the first clip and the second clip is less than a width of the package lid.

14. The apparatus of claim 12, wherein the first clip and the second clip point inward toward a middle region of the structured element.

15. The apparatus of claim 8, wherein the circuit board, the coolant bath, the chamber, the structured element and the thermal interface material are components within a data center.

16. A method, comprising:
placing thermal interface material on a lid of a semiconductor chip package;
placing a structured element on the thermal interface material such that the thermal interface material is between the lid and the structured element, the structured element including a structured surface to nucleate bubbles in a coolant bath; and
attaching the structured element to sides of the semiconductor chip package by pressing fixturing elements of the structured element toward the lid to secure the structured element to at least first and second ones of the sides of the semiconductor chip package, the structured element having a first thermal resistance, a bond line thickness of the thermal interface material being formed between the lid and the structured element that results in the thermal interface material having a second thermal resistance that is greater than the first thermal resistance and within an order of magnitude of the first thermal resistance.

17. The method of claim 16, further including operating a semiconductor chip within the semiconductor chip package while the semiconductor chip package, the thermal interface material, and the structured element are immersed in the coolant bath.

18. The method of claim 17, wherein the bubbles are to nucleate within the coolant bath from structured features of the structured surface of the structured element.

19. The method of claim 16, wherein the bond line thickness is 100 μm or less.

20. The method of claim 16, wherein there is less than 100% coverage of the thermal interface material on the lid.

* * * * *